United States Patent
Wu

(10) Patent No.: US 11,768,227 B1
(45) Date of Patent: Sep. 26, 2023

(54) MULTI-LAYER PROBES HAVING LONGITUDINAL AXES AND PREFERENTIAL PROBE BENDING AXES THAT LIE IN PLANES THAT ARE NOMINALLY PARALLEL TO PLANES OF PROBE LAYERS

(71) Applicant: Microfabrica Inc., Van Nuys, CA (US)

(72) Inventor: Ming Ting Wu, San Jose, CA (US)

(73) Assignee: MICROFABRICA INC., Van Nuys, CA (US)

( * ) Notice: Subject to any disclaimer, the term of this patent is extended or adjusted under 35 U.S.C. 154(b) by 0 days.

(21) Appl. No.: 17/727,336

(22) Filed: Apr. 22, 2022

Related U.S. Application Data

(63) Continuation of application No. 16/799,775, filed on Feb. 24, 2020, now abandoned.

(60) Provisional application No. 62/809,229, filed on Feb. 22, 2019.

(51) Int. Cl.
| | | |
|---|---|---|
| *G01R 1/073* | (2006.01) | |
| *G01R 1/067* | (2006.01) | |
| *H01R 13/24* | (2006.01) | |
| *G01R 31/28* | (2006.01) | |

(52) U.S. Cl.
CPC ..... *G01R 1/07357* (2013.01); *G01R 1/06716* (2013.01); *G01R 31/2863* (2013.01); *H01R 13/2471* (2013.01); *H01R 2201/20* (2013.01)

(58) Field of Classification Search
CPC ............ G01R 1/07357; G01R 1/06716; G01R 31/2863; H01R 13/2471; H01R 2201/20
See application file for complete search history.

(56) References Cited

U.S. PATENT DOCUMENTS

| | | |
|---|---|---|
| 4,026,011 A | 5/1977 | Walton |
| 4,027,935 A | 6/1977 | Byrnes et al. |
| 4,076,356 A | 2/1978 | Tamburro |
| 4,116,523 A | 9/1978 | Coberly et al. |
| 4,618,821 A | 10/1986 | Lenz |
| 4,737,114 A | 4/1988 | Yaegashi |
| 4,773,877 A | 9/1988 | Kruger et al. |
| 5,225,777 A | 7/1993 | Bross et al. |
| 5,286,208 A | 2/1994 | Matsuoka |
| 5,399,982 A | 3/1995 | Driller et al. |
| 5,448,016 A | 9/1995 | DiPaolo et al. |
| 5,865,641 A | 2/1999 | Swart et al. |

(Continued)

FOREIGN PATENT DOCUMENTS

| | | |
|---|---|---|
| DE | 4104215 A1 | 8/1992 |
| GB | 1470007 A | 4/1977 |

(Continued)

OTHER PUBLICATIONS

English Translation of JP-2016105059-A (Year: 2016).*

*Primary Examiner* — Paresh Patel
(74) *Attorney, Agent, or Firm* — Perkins Coie LLP

(57) ABSTRACT

Embodiments are directed to probes formed from multiple layers with at least a portion of the layers including portions that include elastic compliant regions of the probes wherein such elastic portions of different layers are formed of different materials and wherein a plane of preferred elastic deformation of the probes is parallel to a plane containing (1) a normal to the planes of the layers and (2) a longitudinal axes of the probes or a local longitudinal axes of the probes.

17 Claims, 7 Drawing Sheets

(56) References Cited

U.S. PATENT DOCUMENTS

| | | |
|---|---|---|
| 5,917,707 A | 6/1999 | Khandros et al. |
| 5,952,843 A | 9/1999 | Vinh |
| 6,024,579 A | 2/2000 | Bennett |
| 6,033,233 A | 3/2000 | Haseyama et al. |
| 6,252,415 B1 | 6/2001 | Lefever et al. |
| 6,358,097 B1 | 3/2002 | Peters |
| 6,471,524 B1 | 10/2002 | Nakano et al. |
| 6,491,968 B1 | 12/2002 | Mathieu et al. |
| 6,515,496 B2 | 2/2003 | Felici et al. |
| 6,573,738 B1 | 6/2003 | Matsuo et al. |
| 6,624,648 B2 | 9/2003 | Eldridge et al. |
| 6,672,875 B1 | 1/2004 | Mathieu et al. |
| 6,758,682 B1 | 7/2004 | Kosmala |
| 6,855,010 B1 | 2/2005 | Yen |
| 6,859,054 B1 | 2/2005 | Zhou et al. |
| D507,198 S | 7/2005 | Kister |
| 6,920,689 B2 | 7/2005 | Khandros et al. |
| 6,945,827 B2 | 9/2005 | Grube et al. |
| 7,371,072 B2 | 5/2008 | Mathieu et al. |
| 7,553,165 B2 | 6/2009 | Mathieu et al. |
| 7,557,595 B2 | 7/2009 | Chen et al. |
| 7,628,620 B2 | 12/2009 | Gritters |
| 7,629,807 B2 | 12/2009 | Hirakawa et al. |
| 7,690,925 B2 | 4/2010 | Goodman |
| 7,733,101 B2 | 6/2010 | Kister |
| 7,786,740 B2 | 8/2010 | Kister |
| 7,841,863 B2 | 11/2010 | Mathieu et al. |
| 7,850,460 B2 | 12/2010 | Weiland et al. |
| 7,851,794 B2 | 12/2010 | Hobbs |
| 7,944,224 B2 | 5/2011 | Kister |
| 9,052,342 B2 | 6/2015 | Fan et al. |
| 9,097,740 B2 | 8/2015 | Kister |
| 9,476,911 B2 | 10/2016 | Kister |
| 9,702,904 B2 | 7/2017 | Breinlinger et al. |
| 2001/0012739 A1 | 8/2001 | Grube et al. |
| 2002/0008530 A1 | 1/2002 | Kim et al. |
| 2002/0060579 A1 | 5/2002 | Haseyama et al. |
| 2002/0113612 A1 | 8/2002 | Nguyen |
| 2002/0142669 A1 | 10/2002 | Phillips |
| 2004/0121627 A1 | 6/2004 | Grube et al. |
| 2005/0064765 A1 | 3/2005 | Simpson et al. |
| 2005/0070170 A1 | 3/2005 | Zhang et al. |
| 2005/0179458 A1 | 8/2005 | Chen et al. |
| 2005/0184748 A1 | 8/2005 | Chen et al. |
| 2006/0046528 A1 | 3/2006 | Beaman et al. |
| 2006/0073712 A1 | 4/2006 | Suhir |
| 2006/0170440 A1 | 8/2006 | Sudin |
| 2006/0238209 A1 | 10/2006 | Chen et al. |
| 2007/0247175 A1 | 10/2007 | Khandros et al. |
| 2007/0269997 A1 | 11/2007 | Eldridge et al. |
| 2008/0001612 A1 | 1/2008 | Kister |
| 2008/0088327 A1 | 4/2008 | Kister |
| 2008/0100312 A1 | 5/2008 | Breinlinger |
| 2009/0045831 A1 | 2/2009 | Kimoto |
| 2009/0079455 A1 | 3/2009 | Gritters |
| 2009/0183898 A1 | 7/2009 | Kazama et al. |
| 2009/0197484 A1 | 8/2009 | Chen et al. |
| 2009/0263986 A1 | 10/2009 | Mathieu et al. |
| 2010/0134131 A1 | 6/2010 | Chen et al. |
| 2012/0242363 A1 | 9/2012 | Breinlinger et al. |
| 2015/0355235 A1 | 12/2015 | Hsu et al. |
| 2017/0122980 A1 | 5/2017 | Crippa et al. |
| 2019/0064215 A1 | 2/2019 | Park |

FOREIGN PATENT DOCUMENTS

| | | |
|---|---|---|
| JP | H0917535 A | 1/1997 |
| JP | H11162270 A | 6/1999 |
| JP | 2000111577 A | 4/2000 |
| JP | 2000338131 A | 12/2000 |
| JP | 2001337110 A | 12/2001 |
| JP | 2004150874 A | 5/2004 |
| JP | 2004156993 A | 6/2004 |
| JP | 2004340617 A | 12/2004 |
| JP | 2004340654 A | 12/2004 |
| JP | 2008032400 A | 2/2008 |
| KR | 20010030367 A | 4/2001 |
| WO | 2007097559 A1 | 8/2007 |
| WO | 2012128907 A2 | 9/2012 |

\* cited by examiner

MULTI-LAYER PROBES HAVING LONGITUDINAL AXES AND PREFERENTIAL PROBE BENDING AXES THAT LIE IN PLANES THAT ARE NOMINALLY PARALLEL TO PLANES OF PROBE LAYERS

RELATED APPLICATIONS

This application is a continuation of U.S. patent application Ser. No. 16/799,775, filed Feb. 24, 2020, which claims the benefit of U.S. Provisional Patent Application No. 62/809,229, filed Feb. 22, 2019. This application is incorporated herein by reference as if set forth in full herein.

FIELD OF THE INVENTION

The present disclosure relates generally to the field of probes for making contact with electronic devices, e.g. for testing those electronic devices, e.g. semiconductor devices, and more particularly to multi-layer probes having elongated configurations (e.g. longitudinally extending configurations) running parallel to the planes of the layers of the probe with a preferential bending axis (i.e. an axial direction around which an elastic portion of the probe bends, i.e. a direction substantially perpendicular to a plane through which deformation of the probe occurs) located within a plane that is nominally parallel to the planes of the probe layers wherein the preferential direction has a lower stiffness to elastic deformation or smaller thickness, than that of the probe or local portion of the probe in a direction parallel with the planes of the probe layers.

BACKGROUND OF THE INVENTION

Probes:

Probes of various types have been fabricated and used, or have been proposed for use, in the semiconductor testing. As the semiconductor industry continues to drive integrated circuit complexity up and size down (more transistors per unit area), a need exists for new and improved probe designs for contacting such electronic components for testing and other purposes and/or for making permanent contact with such devices and/or with other packaged and unpackaged electronic devices. This need drives probes to smaller sizes (smaller X and Z cross-sectional dimensions and sometimes to shorter lengths, or longitudinal dimensions, in Y), lower contact force, less scrubbing or more controlled scrubbing, while still maintaining high current carrying capacity so that shorts in failed semiconductor devices do not damage the probes.

Numerous electrical contact probe and pin configurations have been commercially used or proposed, some of which may qualify as prior art and others of which do not qualify as prior art. Examples of such pins, probes, and methods of making are set forth in the following patent applications, publications of applications, and patents. Each of these applications, publications, and patents is incorporated herein by reference as if set forth in full herein as are any teachings set forth in each of their prior priority applications.

| U.S. Pat App No., Filing Date U.S. App Pub No., Pub Date U.S. Pat. No., Pub Date | First Named Inventor, "Title" |
|---|---|
| 10/772,943 - Feb. 4, 2004 2005-0104609 - May 19, 2005 | Arat, et al., "Electrochemically Fabricated Microprobes" |
| 10/949,738-Sep. 24, 2019 2006-0006888-Jan. 12, 2006 | Kruglick, et al., "Electrochemically Fabricated Microprobes" |
| 11/028,945-Jan. 3, 2005 2005-0223543 - Oct. 13, 2005 7,640,651 - Jan. 5, 2010 | Cohen, et al., "A Fabrication Process for Co-Fabricating a Multilayer Probe Array and a Space Transformer |
| 11/028,960-Jan 3, 2005 2005-0179458 - Aug. 18, 2005 USP 7,265,565 - Sep. 4, 2007 | Chen, et al. "Cantilever Microprobes for Contacting Electronic Components and Methods for Making Such Probes |
| 11/029,180-Jan. 3, 2005 2005-0184748 - Aug. 25, 2005 | Chen, et al. "Pin-Type Probes for Contacting Electronic Circuits and Methods for Making Such Probes" |
| 11/029,217-Jan. 3, 2005 2005-0221644 - Oct. 6, 2005 7,412,767-Aug. 19, 2008 | Kim, et al., "Microprobe Tips and Methods for Making" |
| 11/173,241 - Jun. 30, 2005 2006-0108678 - May 25, 2006 | Kumar, et al., Probe Arrays and Method for Making |

| US Pat App No., Filing Date US App Pub No., Pub Date US Patent No., Pub Date | First Named Inventor, "Title" |
|---|---|
| 11/178,145-Jul. 7, 2005 2006-0112550 - Jun. 1,2006 7,273,812-Sep. 25, 2007 | Kim, et al., "Microprobe Tips and Methods for Making" |
| 11/325,404-Jan. 3, 2006 2006-0238209 - Oct. 26, 2006 | Chen, et al., "Electrochemically Fabricated Microprobes" |
| 14/986,500-Dec. 31,2015 2016-0231356 - Aug. 11,2016 | Wu, et al. "Multi-Layer, Multi-Material Micro-Scale and Millimeter-Scale Devices with Enhanced Electrical and/or Mechanical Properties" |
| 16/172,354-Oct. 18, 2018 2019-0204354 - Jul. 4, 2019 | Chen, et al. "Pin-Type Probes for Contacting Electronic Circuits and Methods for Making Such Probes" |

| U.S. Pat App No., Filing Date U.S. App Pub No., Pub Date U.S. Pat. No., Pub Date | First Named Inventor, "Title" |
|---|---|
| 16/584,818-Sep. 26, 2019 | Smalley, "Probes Having Improved Mechanical and/or Electrical Properties for Making Contact between Electronic Circuit Elements and Methods for Making" |
| 16/584,863 - Sep. 26, 2019 | Frodis, "Probes Having Improved Mechanical and/or Electrical Properties for Making Contact between Electronic Circuit Elements and Methods for Making" |
| 16/791,288-Feb. 14, 2020 | Frodis, "Multi-Beam Vertical Probes with Independent Arms Formed of a High Conductivity Metal for Enhancing Current Carrying Capacity and Methods for Making Such Probes" |

A need exists for improved probes that can meet the new challenges that that advances in the semiconductor industry are driving.

SUMMARY OF THE INVENTION

It is an object of some embodiments of the invention to provide meso-scale or microscale probes with each having a preferential bending axis (i.e. an axis that is perpendicular to a plane through which deformation occurs) that lies in a plane that is nominally parallel to the planes of the probe layers or to provide probe arrays which have a plurality of probes with each probe having a preferential deflection plane which is parallel to a plane defined by a normal of the probe layers and a deflection direction of the probe tip when making contact with an electronic component.

In some objects the probes may be vertical probes or even vertical probes configured for use with one or more guide plates.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not necessarily intended that all objects be addressed by any single aspect of the invention even though that may be the case regarding some aspects.

In a first aspect of the invention a multi-layer elongated probe for making an electrical connection, includes: a tip end comprising at least one layer; a base end comprising at least one layer; and an intermediate region comprising at least one elastically compliant region wherein the intermediate region connects the tip end to the base end and wherein the intermediate region is formed from at least three layers and at least two distinct materials wherein for a plurality of pairs of adjacent layers, each pair includes a first adjacent layer and a second adjacent layer wherein a material on one of the first and second adjacent layers is different from a material on the other of the first and second adjacent layers, wherein the elastically compliant region of the probe has a preferential bending axis that extends substantially parallel to planes of the layers when subjected to a compressive force between the base end and the tip end.

Numerous variations of the first aspect of the invention are possible and include, for example: (1) the electrical connection being selected from the group consisting of: (a) a temporary connection for wafer level testing of a semiconductor device; (b) a temporary connection for testing an electronic component comprising a diced semiconductor device; (c) a temporary connection for an electronic component comprising a packaged semiconductor device; (d) a permanent connection for testing an electronic component comprising a diced semiconductor device; and (e) a permanent connection for an electronic component comprising a packaged semiconductor device; (2) each of a plurality of layers of the probe having a substantially uniform thickness in a layer stacking direction across their widths and lengths and a ratio of a longitudinal length of the probe to a thickness of the elastically compliant region of the probe in a layer stacking direction being selected from the group consisting of (a)>40, (b)>60, (c)>80, (d)>100, and (e)>120 and wherein a ratio of a longitudinal length of the probe is to a width of the elastically compliant region of the probe perpendicular to a layer stacking direction being selected from the group consisting of (a)>40, (b)>60, (c)>80, (d)>100, and (e)>120; (3) the layers being planar; (4) the probe having a curvature in width along at least a portion of its length; (5) the probe having a stepped structure, or stepped curvature, in a layer stacking direction along at least a portion of its length; (6) the probe being formed as a linear structure; (7) the probe including at least one curved planar region in its elastic region; (8) the at least three layers being at least four layers; (9) the at least three layers being at least five layers; (10) the at least three layers being at least seven layers; (11) a thickness of the elastically compliant portion of the probe in a stacking direction of the layers being less than a width of the elastically compliant portion of the probe within the planes of the layers; (12) a thicknesses of solid material of the elastically compliant portion of the probe less a thickness of any gaps in the solid material in the stacking direction of the layers being less than a total width of solid material less the width of any gaps in material of the elastically compliant portion of the probe within the planes of the layers; (13) the preferential bending axis being based, at least in part, on the thickness of probe in the layer stacking direction in the elastically compliant region being less than a width of the probe; (14) the preferential bending axis being based, at least in part, on a thicknesses of solid material of the elastically compliant portion of the probe less a thickness of any gaps in the solid material in the stacking direction of the layers being less than a total width of solid material less the width of any gaps in material of the elastically compliant portion of the probe within the planes of the layers; (15) the material forming the elastically complaint portion includes a stiffer material (i.e. a material with a higher yield strength) as part of outer probe layers relative to at least one inner layer (i.e. a layer between the outer probe layers); (16) the tip region of the probe including at least one material as part of at least one layer that has a higher yield strength than any material of the elastically compliant portion of outer probe layers; (17) the base region of the probe including at least one material as part of at least one layer that has a higher yield strength than any material of the elastically compliant portion of outer layers; (18) the probe being a vertical probe; and (19) combinations of the above noted variations so long as the combination does not completely remove the benefit of one or more of the combined variations.

In a second aspect of the invention a probe array includes a plurality of multi-layer elongated probes for making an electrical connection, the probe array comprising: (a) a plurality of probes, with each probe comprising: (i) a base end comprising at least one layer; and (ii) an intermediate region comprising at least one elastically compliant region wherein the intermediate region connects the tip end to the base end and wherein the intermediate region is formed from at least three layers and at least two distinct materials wherein for a plurality of pairs of adjacent layers, each pair includes a first adjacent layer and a second adjacent layer wherein a material on one of the first and second adjacent layers is different from a material on the other of the first and second adjacent layers; (b) at least one guide plate for aligning at least one of the top or bottoms of probes in a desired array configuration wherein at least one end of each probe, when held by the guide plate, is capable of movement along an axis when contacted to an electronic component, wherein the elastically compliant region of a plurality of the probes have preferential configurations, when held by the at least one guide plate, to bend in a plane that includes a normal of the multiple layers of each respective probe and the axis of movement of the respective probe when contacted to the electronic component.

Numerous variations of the second aspect of the invention are possible and include, for example: (1) variations similar to those noted for the first aspect; (2) use of different numbers of probes; (2) use of probes with one or more different configurations; (3) probes arranged in linear arrays; (4) probes arranged in areal arrays; (5) probes with different elastic compliances; (6) probes with different bending directions; (7) probes formed of different materials; (8) materials of probes alternating between two or more materials from successive layer to successive layer; (9) probes with more than one material forming part of a single layer: (9) probes with contact tips on both the base end and the tip end; and (10) probes with elastic complaint regions comprising a plurality of beams joined on either end.

In a third aspect of the invention a probe array includes a plurality of multi-layer elongated probes for making an electrical connection, the probe array comprising: (a) a plurality of probes, with each probe comprising: (i) a base end comprising at least one layer; and (ii) an intermediate region comprising at least one elastically compliant region wherein the intermediate region connects the tip end to the base end and wherein the intermediate region is formed from at least three layers and at least two distinct materials wherein for a plurality of pairs of adjacent layers, each pair includes a first adjacent layer and a second adjacent layer wherein a material on one of the first and second adjacent layers is different from a material on the other of the first and second adjacent layers; (b) at least two guide plates for aligning top and bottoms of probes in a desired array configuration wherein at least one end of each probe, when held by the guide plates, is capable of movement along an axis when contacted to an electronic component, wherein the elastically compliant region of a plurality of the probes have preferential configurations, when held by the guide plates, to bend in a plane that includes a normal of the multiple layers of each respective probe and the axis of movement of the respective probe when contacted to the electronic component.

Numerous variations of the third aspect of the invention are possible and include, for example: (1) variations similar to those noted for the first aspect; (2) use of different numbers of probes; (2) use of probes with one or more different configurations; (3) probes arranged in linear arrays; (4) probes arranged in areal arrays; (5) probes with different elastic compliances; (6) probes with different bending directions; (7) probes formed of different materials; (8) materials of probes alternating between two or more materials from successive layer to successive layer; (9) probes with more than one material forming part of a single layer: (9) probes with contact tips on both the base end and the tip end; and (10) probes with elastic complaint regions comprising a plurality of beams joined on either end.

Another aspect of the invention provides a multi-layer, multi-material electrochemical fabrication process for the batch fabrication of probes according to the first aspect or second aspect of the invention including forming a plurality of probes from a plurality of adhered layers on a substrate, with each successive layer including at least two materials, one of which is a structural material and the other of which is a sacrificial material, and wherein each successive layer defines a successive cross-section of the plurality of probes, and wherein the forming of each of the plurality of successive layers includes: (i) depositing a first of the at least two materials; (ii) depositing a second of the at least two materials; and (B) after the forming of the plurality of successive layers, separating at least a portion of the sacrificial material from the structural material to reveal the plurality of probes, wherein the probes include the features set forth in the first or second aspect or one of the variations of such aspects.

Other aspects of the invention will be understood by those of skill in the art upon review of the teachings herein. Other aspects of the invention may involve combinations of the above noted aspects of the invention. These other aspects of the invention may provide various combinations of the aspects presented above as well as provide other configurations, structures, functional relationships, and processes that have not been specifically set forth above but are taught elsewhere herein.

DETAILED DESCRIPTION OF PREFERRED EMBODIMENTS

Figures 1A, 1B:
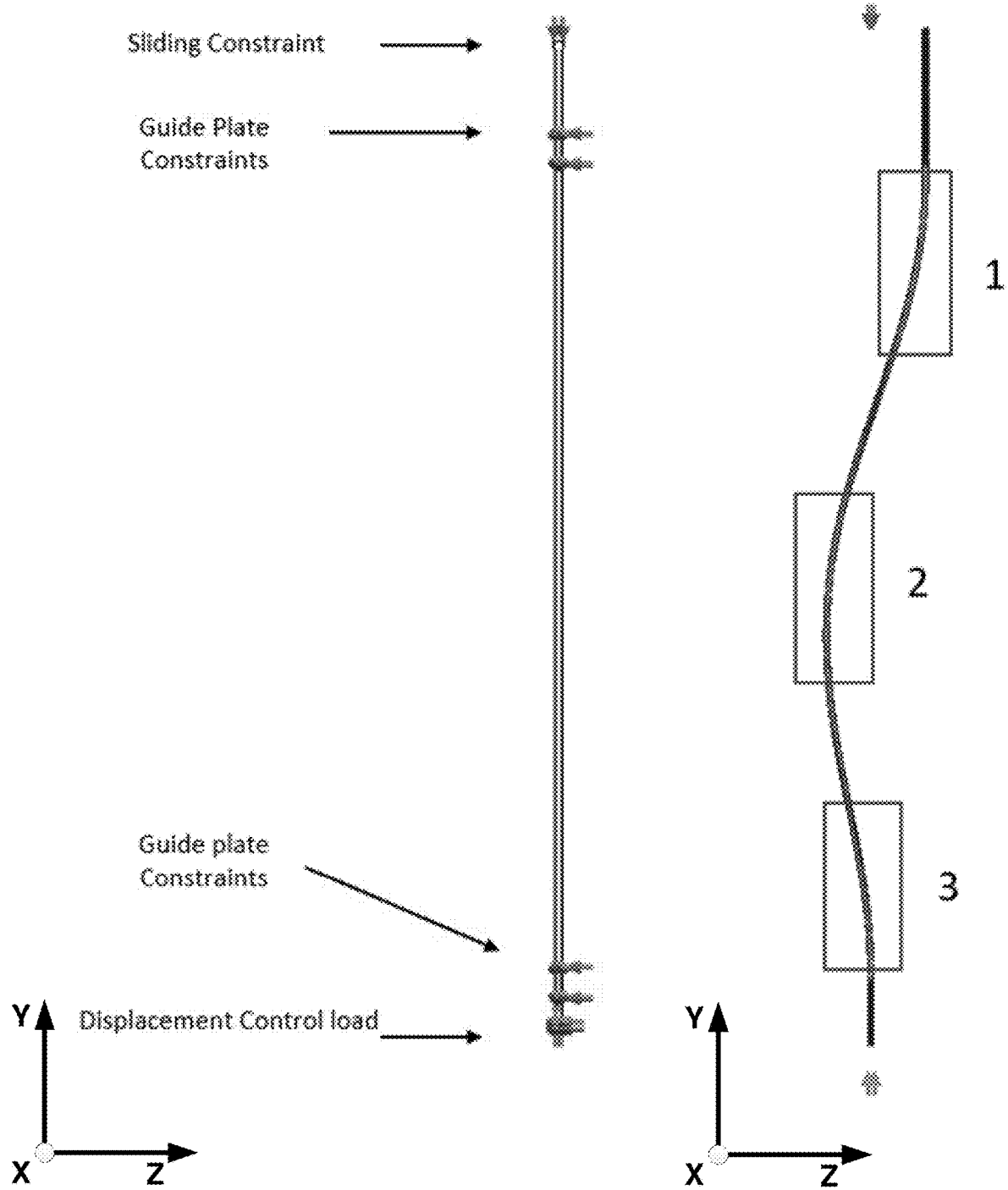
FIG. 1A provides a side view of an example elongated probe having a longitudinal axis extending in Y, with layers stacked in Z, and with a width of the probe extending in X wherein the probe is formed in a straight configuration (uncurved).
FIG. 1B provides a side view of the probe of FIG. 1A after the probe has been subjected to sources of stress: (1) preloading stress that displaces the tip end and distal ends of the probe in the Z direction as it might exist after being loaded into a set of guide plates, and (2) loading stress that results from the tips or ends of the probe being pressed along the Y axis against surfaces (e.g. at least one contact surface and a second contact surface or bonding surface) which cause a Y-direction compression of the probe which results in a bending or bulging of the middle of probe along the negative Z axis to compensate for the compression in Y.
Figures 1, 1C, 2, 3:
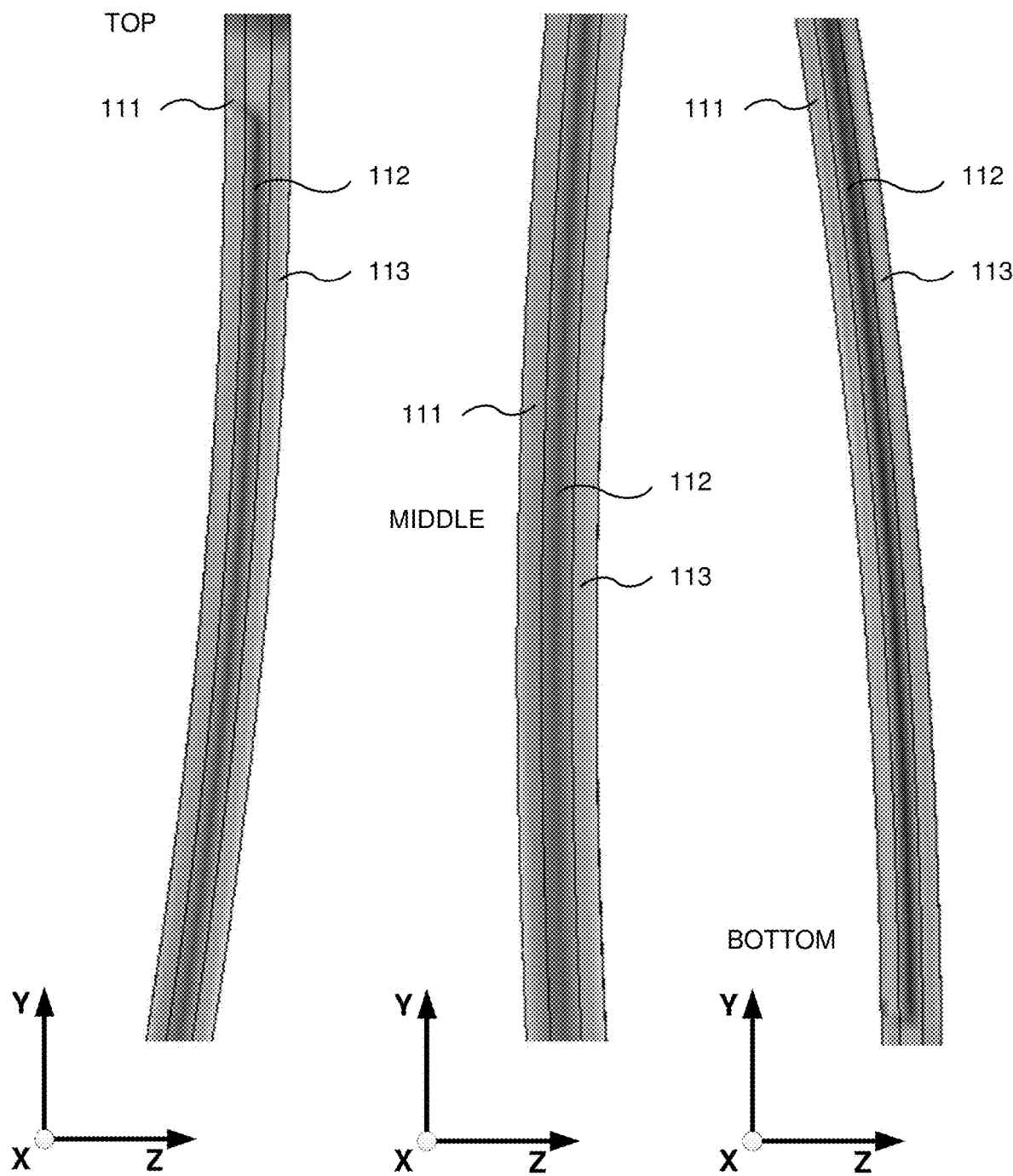
FIGS. 1C-1 to 1C-3 provide blown up views of regions 1, 2 and 3 of the probe of FIG. 1B wherein each of three layers (layers 2, 3 and 4) can be seen and wherein the stress on the third layer (i.e. the middle layer) is relatively low while the stresses on the second (i.e. left) and fourth (i.e. right) layers are higher and particularly higher on the outside portions of the layers where displacement from a neutral line or axis is largest and where curvature is highest.

Multi-layer, multi-material electrochemical fabrication methods may be used in fabricating probes according to some embodiments of the invention. Such probes may be formed, for example, using the contact masking methods of U.S. Pat. No. 6,027,630, by Adam Cohen, entitled "Method For Electrochemical Fabrication", or the adhered masking methods of U.S. Pat. No. 5,190,637 by Henry Guckel, entitled "Formation of Microstructures by Multiple Level Deep X-ray Lithography with Sacrificial Metal Layers". Some such methods may use photoresist or other dielectric materials as sacrificial materials as opposed to the metal materials of the primary embodiments of the above noted patents. Other methods may also be used in fabricating the probes of various embodiments of the present invention some such methods are set forth in the various other patents and applications referenced herein. Each of these patents and applications is hereby incorporated herein by reference.

Definitions

This section of the specification is intended to set forth definitions for a number of specific terms that may be useful in describing the subject matter of the various embodiments of the invention. It is believed that the meanings of most if not all of these terms is clear from their general use in the specification but they are set forth hereinafter to remove any ambiguity that may exist. It is intended that these definitions be used in understanding the scope and limits of any claims that use these specific terms. As far as interpretation of the claims of this patent disclosure are concerned, it is intended that these definitions take presence over any contradictory definitions or allusions found in any materials which are incorporated herein by reference.

"Build" as used herein refers, as a verb, to the process of building a desired structure (or part) or plurality of structures (or parts) from a plurality of applied or deposited materials which are stacked and adhered upon application or deposition or, as a noun, to the physical structure (or part) or structures (or parts) formed from such a process. Depending on the context in which the term is used, such physical structures may include a desired structure embedded within a sacrificial material or may include only desired physical structures which may be separated from one another or may require dicing and/or slicing to cause separation.

"Build axis" or "build orientation" is the axis or orientation that is substantially perpendicular to substantially planar levels of deposited or applied materials that are used in building up a structure. The planar levels of deposited or applied materials may be or may not be completely planar but are substantially so in that the overall extent of their cross-sectional dimensions are significantly greater than the height of any individual deposit or application of material (e.g. 100, 500, 1000, 5000, or more times greater). The planar nature of the deposited or applied materials may come about from use of a process that leads to planar deposits or it may result from a planarization process (e.g. a process that includes mechanical abrasion, e.g. lapping, fly cutting, grinding, or the like) that is used to remove material regions of excess height. Unless explicitly noted otherwise, "vertical" as used herein refers to the build axis or nominal build axis (if the layers are not stacking with perfect registration) while "horizontal" refers to a direction within the plane of the layers (i.e. the plane that is substantially perpendicular to the build axis).

"Build layer" or "layer of structure" as used herein does not refer to a deposit of a specific material but instead refers to a region of a build located between a lower boundary level and an upper boundary level which generally defines a single cross-section of a structure being formed or structures which are being formed in parallel. Depending on the details of the actual process used to form the structure, build layers are generally formed on and adhered to previously formed build layers. In some processes the boundaries between build layers are defined by planarization operations which result in successive build layers being formed on substantially planar upper surfaces of previously formed build layers. In some embodiments, the substantially planar upper surface of the preceding build layer may be textured to improve adhesion between the layers. In other build processes, openings may exist in or be formed in the upper surface of a previous but only partially formed build layers such that the openings in the previous build layers are filled with materials deposited in association with current build layers which will cause interlacing of build layers and material deposits. Such interlacing is described in U.S. patent application Ser. No. 10/434,519 now U.S. Pat. No. 7,252,861. This referenced application is incorporated herein by reference as if set forth in full. In most embodiments, a build layer includes at least one primary structural material and at least one primary sacrificial material. However, in some embodiments, two or more primary structural materials may be used without a primary sacrificial material (e.g. when one primary structural material is a dielectric and the other is a conductive material). In some embodiments, build layers are distinguishable from each other by the source of the data that is used to yield patterns of the deposits, applications, and/or etchings of material that form the respective build layers. For example, data descriptive of a structure to be formed which is derived from data extracted from different vertical levels of a data representation of the structure define different build layers of the structure. The vertical separation of successive pairs of such descriptive data may define the thickness of build layers associated with the data. As used herein, at times, "build layer" may be loosely referred simply as "layer". In many embodiments, deposition thickness of primary structural or sacrificial materials (i.e. the thickness of any particular material after it is deposited) is generally greater than the layer thickness and a net deposit thickness is set via one or more planarization processes which may include, for example, mechanical abrasion (e.g. lapping, fly cutting, polishing, and the like) and/or chemical etching (e.g. using selective or non-selective etchants). The lower boundary and upper boundary for a build layer may be set and defined in different ways. From a design point of view they may be set based on a desired vertical resolution of the structure (which may vary with height). From a data manipulation point of view, the vertical layer boundaries may be defined as the vertical levels at which data descriptive of the structure is processed or the layer thickness may be defined as the height separating successive levels of cross-sectional data that dictate how the structure will be formed. From a fabrication point of view, depending on the exact fabrication process used, the upper and lower layer boundaries may be defined in a variety of different ways. For example by planarization levels or effective planarization levels (e.g. lapping levels, fly cutting levels, chemical mechanical polishing levels, mechanical polishing levels, vertical positions of structural and/or sacrificial materials after relatively uniform etch back following a mechanical or chemical mechanical planarization process). For example, by levels at which process steps or operations are repeated. At levels at which, at least theoretically, lateral extends of structural material can be changed to define new cross-sectional features of a structure.

"Layer thickness" is the height along the build axis between a lower boundary of a build layer and an upper boundary of that build layer.

"Planarization" is a process that tends to remove materials, above a desired plane, in a substantially non-selective manner such that all deposited materials are brought to a substantially common height or desired level (e.g. within 20%, 10%, 5%, or even 1% of a desired layer boundary level). For example, lapping removes material in a substantially non-selective manner though some amount of recession of one material or another may occur (e.g. copper may recess relative to nickel). Planarization may occur primarily via mechanical means, e.g. lapping, grinding, fly cutting, milling, sanding, abrasive polishing, frictionally induced melting, other machining operations, or the like (i.e. mechanical planarization). Mechanical planarization may be followed or preceded by thermally induced planarization (e.g. melting) or chemically induced planarization (e.g. etching). Planarization may occur primarily via a chemical and/or electrical means (e.g. chemical etching, electrochemical etching, or the like). Planarization may occur via a simultaneous combination of mechanical and chemical etching (e.g. chemical mechanical polishing (CMP)).

"Structural material" as used herein refers to a material that remains part of the structure when put into use.

"Sacrificial material" is material that forms part of a build layer but is not a structural material. Sacrificial material on a given build layer is separated from structural material on that build layer after formation of that build layer is completed and more generally is removed from a plurality of layers after completion of the formation of the plurality of layers during a "release" process that removes the bulk of the sacrificial material or materials. In general sacrificial material is located on a build layer during the formation of one, two, or more subsequent build layers and is thereafter removed in a manner that does not lead to a planarized surface. Materials that are applied primarily for masking purposes, i.e. to allow subsequent selective deposition or etching of a material, e.g. photoresist that is used in forming a build layer but does not form part of the build layer) or that exist as part of a build for less than one or two complete build layer formation cycles are not considered sacrificial materials as the term is used herein but instead shall be referred as masking materials or as temporary materials. These separation processes are sometimes referred to as a release process and may or may not involve the separation of structural material from a build substrate. In many embodiments, sacrificial material within a given build layer is not removed until all build layers making up the three-dimensional structure have been formed. Of course sacrificial material may be, and typically is, removed from above the upper level of a current build layer during planarization operations during the formation of the current build layer. Sacrificial material is typically removed via a chemical etching operation but in some embodiments may be removed via a melting operation or electrochemical etching operation. In typical structures, the removal of the sacrificial material (i.e. release of the structural material from the sacrificial material) does not result in planarized surfaces but instead results in surfaces that are dictated by the boundaries of structural materials located on each build layer. Sacrificial materials are typically distinct from structural materials by having different properties therefrom (e.g. chemical etchability, hardness, melting point, etc.) but in some cases, as noted previously, what would have been a sacrificial material may become a structural material by its actual or effective encapsulation by other structural materials. Similarly, structural materials may be used to form sacrificial structures that are separated from a desired structure during a release process via the sacrificial structures being only attached to sacrificial material or potentially by dissolution of the sacrificial structures themselves using a process that is insufficient to reach structural material that is intended to form part of a desired structure. It should be understood that in some embodiments, small amounts of structural material may be removed, after or during release of sacrificial material. Such small amounts of structural material may have been inadvertently formed due to imperfections in the fabrication process or may result from the proper application of the process but may result in features that are less than optimal (e.g. layers with stairs steps in regions where smooth sloped surfaces are desired. In such cases the volume of structural material removed is typically minuscule compared to the amount that is retained and thus such removal is ignored when labeling materials as sacrificial or structural. Sacrificial materials are typically removed by a dissolution process, or the like, that destroys the geometric configuration of the sacrificial material as it existed on the build layers. In many embodiments, the sacrificial material is a conductive material such as a metal. As will be discussed hereafter, masking materials though typically sacrificial in nature are not termed sacrificial materials herein unless they meet the required definition of sacrificial material.

"Adhesion layer", "seed layer", "barrier layer", and the like refer to coatings of material that are thin in comparison to the layer thickness and thus generally form secondary structural material portions or sacrificial material portions of some layers. Such coatings may be applied uniformly over a previously formed build layer, they may be applied over a portion of a previously formed build layer and over patterned structural or sacrificial material existing on a current (i.e. partially formed) build layer so that a non-planar seed layer results, or they may be selectively applied to only certain locations on a previously formed build layer. In the event such coatings are non-selectively applied, selected portions may be removed (1) prior to depositing either a sacrificial material or structural material as part of a current layer or (2) prior to beginning formation of the next layer or they may remain in place through the layer build up process and then etched away after formation of a plurality of build layers.

"Masking material" is a material that may be used as a tool in the process of forming a build layer but does not form part of that build layer. Masking material is typically a photopolymer or photoresist material or other material that may be readily patterned. Masking material is typically a dielectric. Masking material, though typically sacrificial in nature, is not a sacrificial material as the term is used herein. Masking material is typically applied to a surface during the formation of a build layer for the purpose of allowing selective deposition, etching, or other treatment and is removed either during the process of forming that build layer or immediately after the formation of that build layer.

"Multilayer structures" are structures formed from multiple build layers of deposited or applied materials.

"Multilayer three-dimensional (or 3D or 3-D) structures" are Multilayer Structures where the structural material portion of at least one layer includes a region not bounded by the structural material of the other layer.

"Complex multilayer three-dimensional (or 3D or 3-D) structures" are multilayer three-dimensional structures formed from at least three layers where a line may be defined that hypothetically extends vertically through at least some portion of the build layers of the structure will extend from structural material through sacrificial material and back through structural material or will extend from sacrificial material through structural material and back through sacrificial material (these might be termed vertically complex multilayer three-dimensional structures). Alternatively, complex multilayer three-dimensional structures may be defined as multilayer three-dimensional structures formed from at least two layers where a line may be defined that hypothetically extends horizontally through at least some portion of a build layer of the structure that will extend from structural material through sacrificial material and back through structural material or will extend from sacrificial material through structural material and back through sacrificial material (these might be termed horizontally complex multilayer three-dimensional structures). Worded another way, in complex multilayer three-dimensional structures, a vertically or horizontally extending hypothetical line will extend from one or structural material or void (when the sacrificial material is removed) to the other of void or structural material and then back to structural material or void as the line is traversed along at least a portion of the line.

"Moderately complex multilayer three-dimensional (or 3D or 3-D) structures are complex multilayer 3D structures for which the alternating of void and structure or structure and void not only exists along one of a vertically or horizontally extending line but along lines extending both vertically and horizontally.

"Highly complex multilayer (or 3D or 3-D) structures are complex multilayer 3D structures for which the structure-to-void-to-structure or void-to-structure-to-void alternating occurs once along the line but occurs a plurality of times along a definable horizontally or vertically extending line.

Probes:

Some embodiments are directed to vertical probes or pin probes. These probes may be formed with their longitudinal axes (i.e. tip-to-tip axes, tip-to-tip heights, base-to-tip axes, or base-to-tip heights) oriented perpendicular to a layer stacking axis or layer surface normal when being formed from a single layer or from the buildup of a plurality of layers (i.e. with their longitudinal axes being oriented parallel to the lateral extents of a layer or layers from which the probe is formed). Alternatively, the longitudinal axes of the probes may be formed parallel to a stacking axis of the layers or at some other angle between parallel and perpendicular to the stacking axis of the layers. Unlike cantilever probes, vertical probes typically have longitudinal extents (e.g. heights in Z) that are much greater than their lateral extends (e.g. widths in X and Y). For example, the ratio of height to maximum width for vertical probes may be in range from 5/1 or 10/1 to 100/1 or more. Unlike cantilever probes, vertical probes can be arranged into two-dimensional arrays with close packing, or pitch, in both X and Y directions simultaneously. As used herein, nominal pitch or minimum pitch is the closest, used or useable, tip-to-tip spacing of two adjacent similar probes that are similarly oriented. A packing ratio, PR (minimum or nominal pitch) of acceptable tip-to-tip spacing of adjacent vertical probes in X (to acceptable tip-to-tip vertical probe spacing in Y may be within $\frac{1}{5}$ and 5, i.e. $\frac{1}{5}<=PR<=5$, and is often within $\frac{1}{2}$ to 2, and in practice is believed to often be within a 0.9 to 1.1 packing ratio). In many vertical probe arrays, the tip-to-tip spacing between probes in X is less than 5 times the width of the probe in X, i.e. the spacing/width ratio is less than about five, and similarly the spacing between probes in Y is less than about 5 times the width of the probe in Y. The spacing to width ratio in both X and Y is often less than 3 and is often about 2 or less.

Various embodiments of the invention provide probes that bend preferentially along paths that are oriented perpendicular to the planes that contain the layers of the probes and that are parallel to the longitudinal axes of the probes. In some embodiments, probes may twist upon bending but the primary path of movement of the compliant portion of the probe is in a plane including a plane through defined by a local longitudinal axis of the probe and a perpendicular to the planes of the layers. In some embodiments the probes are formed as linear structures and provided with a pre-bent configuration upon array formation while in other embodiments the probes are formed with a pre-bent or stair stepped configuration that provides for, at least in part, a preferential bending axis which is perpendicular to a plane in which bending occurs, while in still other embodiments a combination of bent or stair stepped formation in combination with pre-bending during array formation are used.

FIG. 1A provides a side view of an example elongated probe having a longitudinal axis extending in Y, with layers stacked in Z, and with a width of the probe extending in X wherein the probe is formed in a straight configuration (uncurved). FIG. 1A also provides examples constraints that may be placed on the probe when held in guide plates and when subject to longitudinal compressive forces when making contact with an electronic device that is, for example, under test (i.e. a DUT).

FIG. 1B provides a side view of the probe of FIG. 1A after the probe has been subjected to sources of constraint and stress including: (1) preloading constraints and stress that displaces the tip end (bottom) and distal end (top) of the probe in the Z direction as the probe might exist after being loaded into a set of guide plates, and (2) loading stress that results from the tip of the probe being pressed along the Y axis by a contact surface of an electronic device which cause a Y-direction displacement and compression of the probe when the distal end is contacted with a surface of a second electronic component, such as a PCB or space transformer, which results in a bending or bulging of the middle of probe along the negative Z axis, in this example, to compensate for the compression that is forced to occur in Y.

FIGS. 1C-1 to 1C-3 provide blown up views of regions 1, 2 and 3 of the probe of FIG. 1B wherein each of three layers (layers 2, 3 and 4) can be seen and wherein the stress on the third layer (i.e. the middle layer 112) is relatively low while the stresses on the second layer (i.e. left layer 111) and fourth layer (i.e. right layer 113) are higher and particularly on the outside portions of the layers (i.e. left most portion of the left layer 111 and right most portion of the right layer 113) where displacement from a neutral line (e.g. a center layer of the third layer) is largest and where curvature is highest (i.e. radius of curvature is smallest). In other embodiments with different probe widths, different layer thicknesses, different number of layers, different variations in cross-sectional width or thickness, different probe lengths, different preloading stresses, and/or different "as formed" configurations, will result in different ultimate probe curvatures and different stress distributions.

Figure 1D:
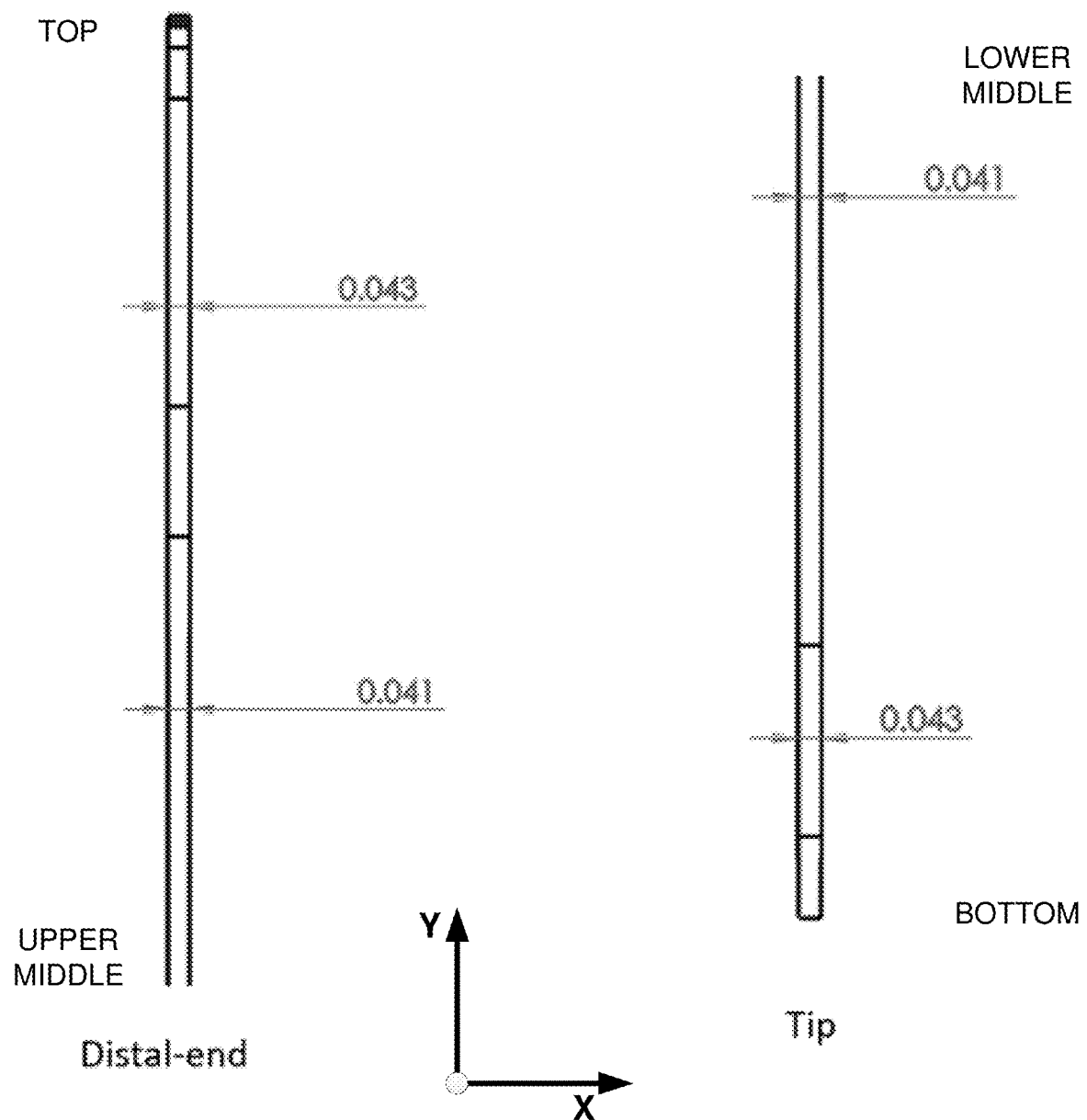
FIG. 1D shows two blown up views of the ends of the probe (i.e. distal end on left and tip end on the right) similar to that of FIGS. 1A-1C-3 rotated 90° so that the width of an example probe in X can be seen and so that a potential thickening of the width (in X) of the design of the probe in regions of high stress (e.g. near guide plate induced being locations) can be seen so as to shift stress and bending to other portions of the probe length.

FIG. 1D shows two blown up views (distal end view and tip view) of a probe similar to that of FIGS. 1A-1C-3 rotated 90° so that the width of an example probe in X can be seen and so that a potential thickening of the width (in X) of the design of the probe in regions of high stress (e.g. in regions of probe interaction with a guide plate) can be seen so as to shift stress and bending to other portions of the probe length. In other embodiments uniform cross-sectional widths may be used along the entire probe length or along the elastically compliant portion of the probe, variations in size other than the 2 micron variation shown (from 0.041 to 0.043 millimeters) may be used. For example, the variation may be as small as 1 micron or less or as much as 5, 10 or even 20 microns or more. In some embodiments depending on the materials being used the total thickness of the layers forming the compliant section of the probe may be considerably less than the widths shown in FIG. 1D or they may be slightly less, approximately the same or even slightly larger. In some embodiments, the thickness of the layers and the width of the layers will be selected, based on the materials being used, such that a bending moment within the plane of the layers is larger than a bending moment that is in the direction of the layer normal such that preferential bending will occur in the direction of the layer normal when the probe is subject to compressive forces on its tip and base.

Figure 2A:
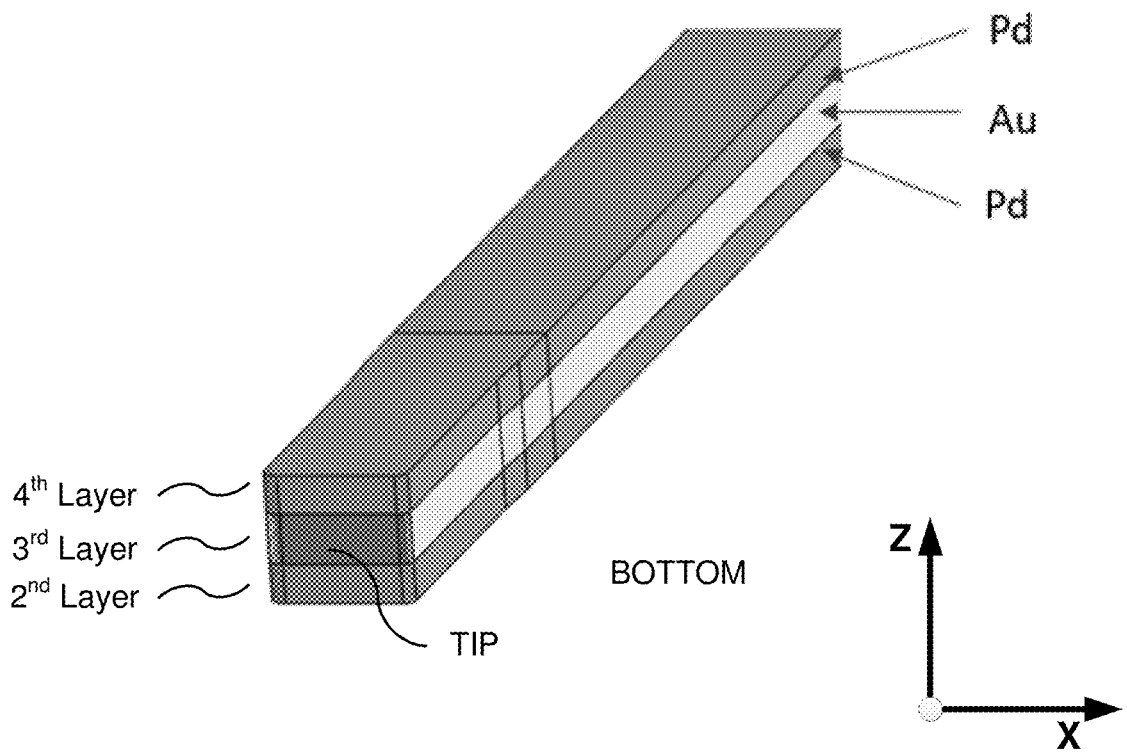
FIGS. 2A-2C show blown up views of the tip, middle, and distal ends or a sample probe according to some embodiments of the invention where the probe is formed from five layers with the second—forth layers forming the ends and the compliant portion of the body of the probe and with the first and fifth layers forming guide plate stops of positioning elements of the probe (as seen in FIG. 2C).
Figure 2B:
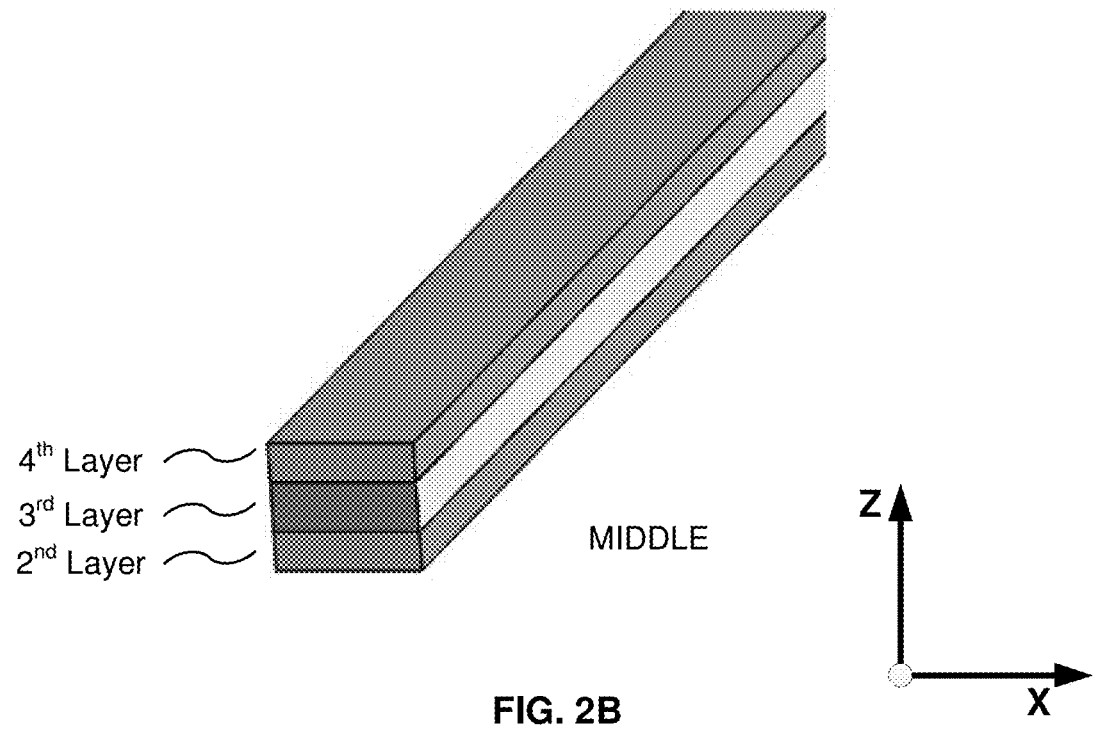
Figure 2C:
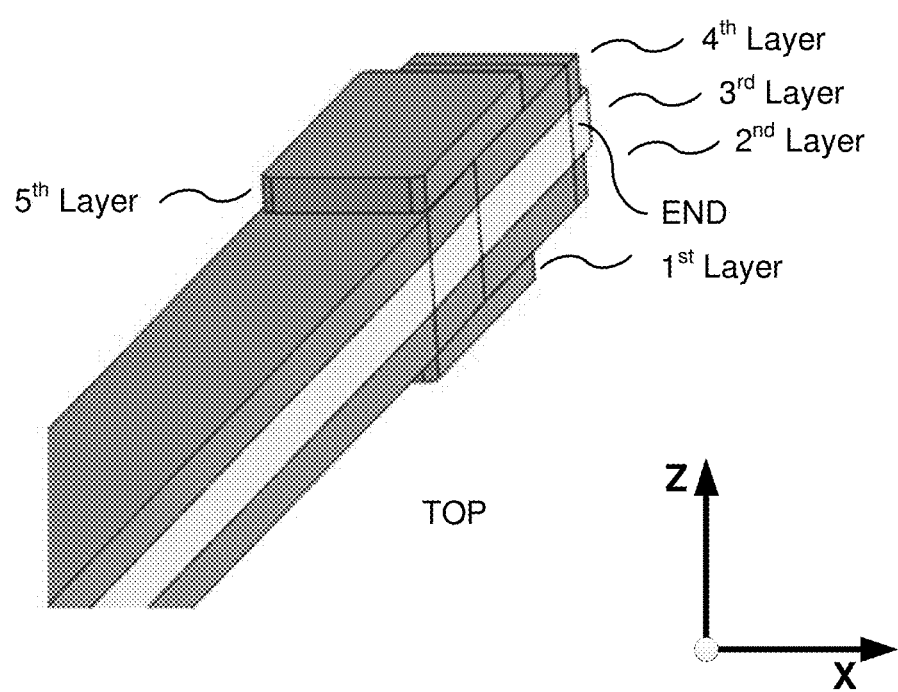

FIGS. 2A-2C show blown up views of the tip, middle, and distal ends or a sample probe according to some embodiments of the invention where the probe is formed from five layers with the second—forth layers forming both the tip and distal ends as well as the compliant portion of the body of the probe and with the first and fifth layers forming guide plate stops of positioning elements of the probe (as seen in FIG. 2C). In some variations the one layer, e.g. the center lay may extend beyond the other layers to from a finer contact region on one or both of the tip end and the distal end. In some alternative embodiments, the probe may take on non-linear configurations as formed, may have no stops, may have stops in different locations, may have varying width or thickness, may take on linear or non-linear configurations when loaded into guide plates or mounted to a substrate, may use different materials other the palladium-gold-palladium stack of materials as set forth in the this example, may include use of a different tip material on one or both ends (e.g. a higher yield strength material or a more abrasion resistant material), or may be formed from a different number of layers along with different combinations of material stacks. In some embodiments, a higher yield strength material (e.g. palladium) is located at the portions of the probe (e.g. layers or layer portions) that undergo higher stress while a lower yield strength material (e.g. gold) may be preferentially located or limited to locations where the stress is lower. In particular it is preferable that the stress experienced by each portion of the probe is less than a yield strength of that portion of the probe (more preferably less than 80% of the yield strength or even 50% of the yield strength, or even less under the given operating conditions so as to limit potential for permanent probe deformation (e.g. creep) or breakage as a result of loading while still providing improved current carrying capacity by use of a higher conductivity material (e.g. gold, silver, or copper) in regions of lower stress).

Figure 3A:
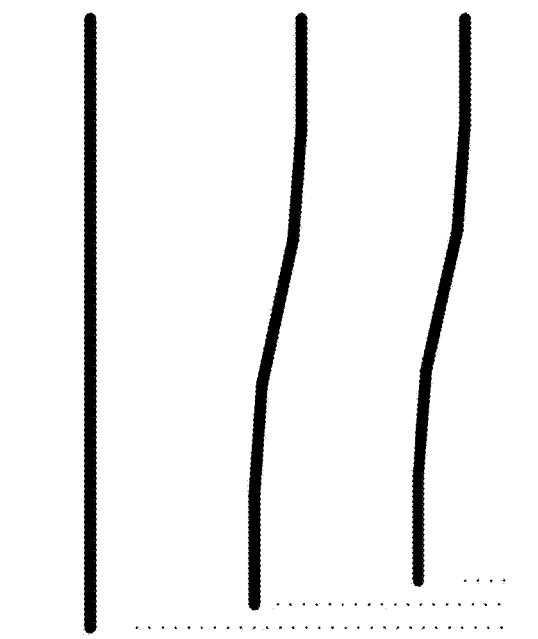
FIG. 3A provides side views of three sample probes that may be used in forming an array of probes similar to those illustrated in FIGS. 3B and 3C wherein upon formation the probe may be linear in configuration (left most probe), may have a bent configuration where the amount of bending is less than that which will exist in an uncompressed probe array (middle probe), or may have a bent configuration which matches that of the bending that will exist in the probes while in an uncompressed array configuration and wherein in this example each probe variation has a similar length.
Figure 3B:
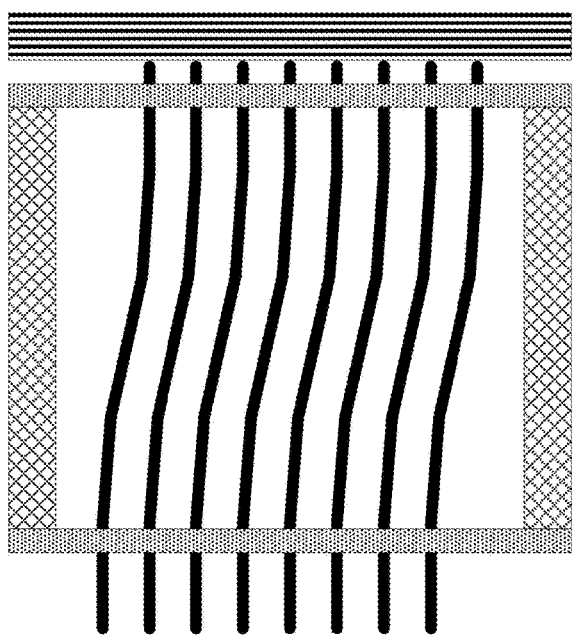
FIG. 3B provides a side view of a probe array while the probes are in contact with an upper contact element while the probes are not in a longitudinally compressed state as no contact is yet made with an electronic component below the array.
Figure 3B:
Figure 3C:
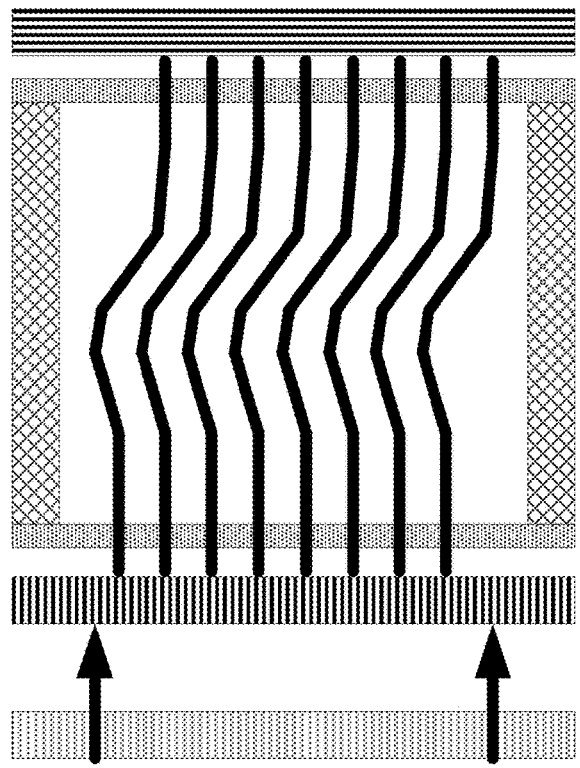
FIG. 3C provides a side view of an example probe array while the probes are in contact with an upper contact element and are also compressed by an electronic component wherein additional deflection of the probes, in a preferential bending direction, can be seen as a result of contact with the electronic component and the relative compression of the upper contact element and the lower electronic component with probes of the array.

FIG. 3A provides side views of three sample probes that may be used in forming an array of probes similar to those illustrated in FIGS. 3B and 3C where upon formation the probe may be linear in configuration (left most probe), may have a bent configuration or stepped configuration (i.e. in a layer stacking direction in this example or in the planes of the layers in an alternative embodiment) where the amount of bending or stair stepping is less than an amount of bending which will exist in an uncompressed probe array (middle probe), or may have a bent or stair stepped configuration (i.e. in a layer stacking direction of this example) which matches that of the bending that will exist in the probes while in an uncompressed array configuration and wherein in this example each probe variation has a similar length.

FIG. 3B provides a side view of a probe array while the probes are in contact with an upper contact element but while the probes are not in a longitudinally compressed state as no contact is yet made with an electronic component below the array.

FIG. 3C provides an example side view of a probe array while the probes are in contact with an upper contact element and are also compressed by contact with a lower electronic component wherein additional deflection of the probes, in a preferential bending direction, can be seen as a result of contact with the electronic component and the relative compression of the electronic components and the probe array.

Figure 4A:
FIGS. 4A-4D illustrate four alternative embodiments where the probes take on non-linear configurations in the layer stacking direction and where material forming successive layers alternates from one material (e.g. Pd or NiCo) to another material (e.g. Au, Ag, or Cu) and where a contact extension exists on each end of the probe where the contact extension includes a different material (e.g. rhodium) than that of the compliant regions of the probes.
Figure 4B:
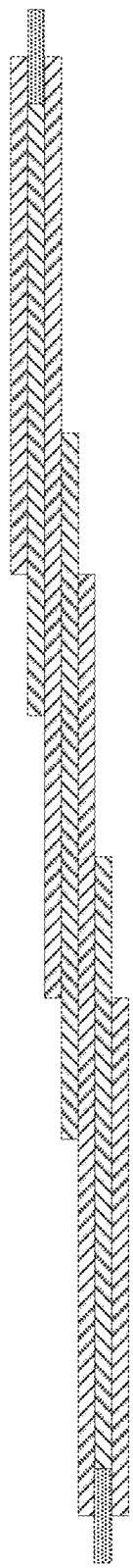
Figure 4C:
Figure 4D:

FIGS. 4A-4D illustrate four alternative embodiments where the probes take on non-linear configurations in the layer stacking direction and where material forming successive layers alternates from one material (e.g. Pd or NiCo) to another material (e.g. Au, Ag, or Cu) and where a contact extension exists on each end of the probe where the contact extension includes a different material (e.g. rhodium) than that of the compliant regions of the probes with FIG. 4A illustrating an example probe with a notch in the compliant central region on the left side of the probe which provides for preferential bending with the compliant portion bulging to the right; (2) FIG. 4B illustrates an example probe with the lower end offset to the right relative to the upper end; (3) FIG. 4C illustrates an example probe with a more distinct C-shaped compliant region with a shifting of the central portion of the probe to the right relative to the probe ends; and (4) FIG. 4D provides for an S-shaped probe.

Other probe shape variations in the layer stacking direction are possible and will be apparent to those of skill in the art upon review of the teachings herein. In still other embodiments a combination of shape variations in the layer stacking direction may exist along with curved or stair-stepped variations within individual layers. In still other variations not all layers need to have be formed with alternating materials (e.g. compliant portions of the probe on some successive layers may be formed of the same material or a combination of materials while in other embodiments more than two materials may be alternated). In still other embodiments, one of the compliant materials may act as a contact material. In still other embodiments some layers may be formed with dielectrics (e.g. for ensuring electrical isolation between adjacent probes or for ensuring electrical isolation between two conductive paths on a single probe). In some embodiments, probes may have a contact tip on one end and be configured for bonding to a circuit element on the other end as opposed to having two contact tips. Some probes may include materials to aid in bonding while other probes may include materials in selected side-facing regions that allow for wear resistant sliding contact with a guide plate or the other array supporting structure.

Further Comments and Conclusions

Probe structures may take on a variety of different configurations, be formed using different processes, and be made to contain a variety of different materials to improve overall probe and array functionality. Some embodiments may form probes using selective deposition processes or blanket deposition processes on some layers that are not electrodeposition processes. Some probes may be formed using aligned, stacked and bonded preformed sheets of material alone or in combination with dispensed materials. Sheets may be subjected to laser cutting before stacking (if probe cross-sections remain in position by a bridging layer or by tethering) or after stacking and bonding. Bonded sheets may be subject to blanket or selective material deposition when additional materials are to be incorporated wherein such deposition may occur before or after any machining of the sheet material. Some embodiments may use nickel as a structural material while other embodiments may use different materials. For example, preferred spring materials include nickel (Ni), beryllium copper (Be—Cu), nickel phosphorous (Ni—P), titanium (Ti), tungsten (W), aluminum copper (Al—Cu), steel, Paliney 7 (Pd—Ag—Au—Pt) alloy, palladium (Pd), molybdenum (Mo), manganese (Mn), chrome or chromium (Cr), chromium copper (Cr—Cu), and combinations of these. Materials for enhanced current carrying capacity may for example include copper (Cu), silver (Ag), or gold (Au). Materials for use on contact or interface surfaces may have enhanced abrasion resistance or other properties and may, for example, include the spring materials noted above and may, for example, additionally or alternatively include materials such as rhodium (Rh), rhenium (Re), tungsten carbide (W—C), and palladium gold alloys (Pd—Au). Additional examples of such configurations and processes can be found in the patents and applications set forth in the following paragraphs and in the following table as well as in various patents and applications set forth herein above. All such patents and applications are incorporated herein by reference.

Structural or sacrificial dielectric materials may be incorporated into embodiments of the present invention in a variety of different ways. Such materials may form a third material or higher deposited material on selected layers or may form one of the first two materials deposited on some layers. Additional teachings concerning the formation of structures on dielectric substrates and/or the formation of structures that incorporate dielectric materials into the formation process and possibility into the final structures as formed are set forth in a number of patent applications filed Dec. 31, 2003: (1) U.S. Patent Application No. 60/534,184 which is entitled "Electrochemical Fabrication Methods Incorporating Dielectric Materials and/or Using Dielectric Substrates"; (2) U.S. Patent Application No. 60/533,932, which is entitled "Electrochemical Fabrication Methods Using Dielectric Substrates"; (3) U.S. Patent Application No. 60/534,157, which is entitled "Electrochemical Fabrication Methods Incorporating Dielectric Materials"; (4) U.S. Patent Application No. 60/533,891, which is entitled "Methods for Electrochemically Fabricating Structures Incorporating Dielectric Sheets and/or Seed layers That Are Partially Removed Via Planarization"; and (5) U.S. Patent Application No. 60/533,895, which is entitled "Electrochemical Fabrication Method for Producing Multi-layer Three-Dimensional Structures on a Porous Dielectric". These patent filings are each hereby incorporated herein by reference as if set forth in full herein.

Additional patent filings that provide, intra alia, teachings concerning incorporation of dielectrics into electrochemical fabrication processes include (1) U.S. patent application Ser. No. 11/139,262, filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization"; (2) U.S. patent application Ser. No. 11/029,216, filed Jan. 3, 2005 by Cohen, et al., now abandoned, and which is entitled "Electrochemical Fabrication Methods Incorporating Dielectric Materials and/or Using Dielectric Substrates". (3) U.S. patent application Ser. No. 11/028,957, by Cohen, which was filed on Jan. 3, 2005, now abandoned, and which is entitled "Incorporating Dielectric Materials and/or Using Dielectric Substrates"; (4) U.S. patent application Ser. No. 10/841,300, by Lockard et al., which was filed on May 7, 2004, now abandoned, and which is entitled "Methods for Electrochemically Fabricating Structures Using Adhered Masks, Incorporating Dielectric Sheets, and/or Seed Layers that are Partially Removed Via Planarization"; (5) U.S. patent application Ser. No. 10/841,378, by Lembrikov et al., which was filed on May 7, 2004, now U.S. Pat. No. 7,527,721, and which is entitled "Electrochemical Fabrication Method for Producing Multi-layer Three-Dimensional Structures on a Porous Dielectric; (5) U.S. patent application Ser. No. 11/325,405, filed Jan. 3, 2006 by Dennis R. Smalley, now abandoned, and entitled "Method of Forming Electrically Isolated Structures Using Thin Dielectric Coatings"; (6) U.S. patent application Ser. No. 10/607,931, by Brown, et al., which was filed on Jun. 27, 2003, now U.S. Pat. No. 7,239,219, and which is entitled "Miniature RF and Microwave Components and Methods for Fabricating Such Components", (7) U.S. patent application Ser. No. 10/841,006, by Thompson, et al., which was filed on May 7, 2004, now abandoned, and which is entitled "Electrochemically Fabricated Structures Having Dielectric or Active Bases and Methods of and Apparatus for Producing Such Structures"; (8) U.S. patent application Ser. No. 10/434,295, by Cohen, which was filed on May 7, 2003, now abandoned, and which is entitled "Method of and Apparatus for Forming Three-Dimensional Structures Integral With Semiconductor Based Circuitry"; and (9) U.S. patent application Ser. No. 10/677,556, by Cohen, et al., filed Oct. 1, 2003, now abandoned, and which is entitled "Monolithic Structures Including Alignment and/or Retention Fixtures for Accepting Components". These patent filings are each hereby incorporated herein by reference as if set forth in full herein.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full. This application is hereby incorporated herein by reference as if set forth in full.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, enhanced methods of using may be implemented, and the like.

| U.S. Pat App No., Filing Date U.S. App Pub No., Pub Date U.S. Pat. No., Pub Date | First Named Inventor, Title |
|---|---|
| 10/271,574 - Oct. 15, 2002 2003-0127336 - July 10, 2003 7,288,178-Oct. 30,2007 | Cohen, "Methods of and Apparatus for Making High Aspect Ratio Microelectromechanical Structures" |
| US Pat App No., Filing Date US App Pub No., Pub Date US Patent No., Pub Date | First Named Inventor, Title |
| 10/387,958 - Mar. 13,2003 2003-022168 - Dec. 4, 2003 | Cohen, "Electrochemical Fabrication Method and Application for Producing Three-Dimensional Structures Having Improved Surface Finish " |
| 10/434,289 - May 7, 2003 2004-0065555 - Apr. 8, 2004 | Zhang, "Conformable Contact Masking Methods and Apparatus Utilizing In Situ Cathodic Activation of a Substrate" |
| 10/434,294 - May 7, 2003 2004-0065550 - Apr. 8, 2004 | Zhang, "Electrochemical Fabrication Methods With Enhanced Post Deposition Processing" |
| 10/434,315 - May 7, 2003 2003-0234179 - Dec. 25, 2003 7,229,542 - Jun. 12, 2007 | Bang, "Methods of and Apparatus for Molding Structures Using Sacrificial Metal Patterns" |
| 10/434,519 - May 7, 2003 2004-0007470 - Jan. 15, 2004 | Smalley, "Methods and Apparatus for Electrochemically Fabricating Structures via Interlaced layers or Via Selective Etching and Filling of Voids" |
| 10/434,494 - May 7, 2003 2004-0000489 - Jan. 1,2004 | Zhang, "Methods and Apparatus for Monitoring Deposition Quality During Conformable Contact Mask Plating Operations" |
| 10/677,498 - Oct. 1,2003 2004-0134788 - Jul. 15, 2004 7,235,166-Jun. 26, 2007 | Cohen, "Multi-cell Masks and Methods and Apparatus for Using Such Masks To Form Three-Dimensional Structures" |
| 10/697,597 - Dec. 20,2002 2004-0146650 - Jul. 29, 2004 | Lockard, "EFAB Methods and Apparatus Including Spray Metal or Powder Coating Processes" |
| 10/724,513 - Nov. 26, 2003 2004-0147124 - Jul. 29, 2004 7,368,044 - May 6, 2008 | Cohen, "Non-Conformable Masks and Methods and Apparatus for Forming Three-Dimensional Structures" |
| US Pat App No., Filing Date US App Pub No., Pub Date US Patent No., Pub Date | First Named Inventor, Title |
| 10/724,515 - Nov. 26, 2003 2004-0182716 - Sep. 23, 2004 7,291,254 - Nov. 6, 2007 | Cohen, "Method for Electrochemically Forming Structures Including Non-Parallel Mating of Contact Masks and Substrates" |
| 10/830,262 - Apr. 21,2004 2004-0251142 - Dec. 16, 2004 7,198,704 - Apr. 3, 2007 | Cohen, "Methods of Reducing Interlayer Discontinuities in Electrochemically Fabricated Three-Dimensional Structures" |
| 10/841,100 - May 7, 2004 2005-0032362 - Feb. 10, 2005 7,109,118-Sep. 19, 2006 | Cohen, "Electrochemical Fabrication Methods Including Use of Surface Treatments to Reduce Overplating and/or Planarization During Formation of Multi-layer Three-Dimensional Structures" |
| 10/841,347 - May 7, 2004 2005-0072681 - Apr. 7, 2005 | Cohen, "Multi-step Release Method for Electrochemically Fabricated Structures" |

-continued

| U.S. Pat App No., Filing Date U.S. App Pub No., Pub Date U.S. Pat. No., Pub Date | First Named Inventor, Title |
|---|---|
| 10/949,744 - Sep. 24, 2004 | Lockard, "Multi-Layer Three-Dimensional Structures Having Features Smaller Than a Minimum Feature Size Associated with the Formation of Individual Layers" |
| 2005-0126916 - Jun. 16, 2005 | |
| 7,498,714 - Mar. 3, 2009 | |
| 12/345,624 - Dec. 29, 2008 | Cohen, "Electrochemical Fabrication Method Including Elastic Joining of Structures" |
| 8,070,931 - Dec. 6, 2011 | |
| 14/194,564-Feb. 28, 2014 | Kumar, "Methods of Forming Three-Dimensional Structures Having Reduced Stress and/or Curvature" |
| 2014-0238865 - Aug. 28, 2014 | |
| USP 9,540,233 - Jan. 10, 2017 | |
| 14/720,719 - May 22, 2015 | Veeramani, "Methods of Forming Parts Using Laser Machining" |
| 9,878,401 - Jan. 30, 2018 | |
| 14/872,033 -Sep. 30,2015 | Le, "Multi-Layer, Multi-Material Microscale and Millimeter Scale Batch Part Fabrication Methods Including Disambiguation of Good Parts and Defective Parts" |

It will also be understood by those of skill in the art that the probe elements of some aspects of the invention may be formed with processes which are very different from the processes set forth herein, and it is not intended that structural aspects of the invention need to be formed by only those processes taught herein or by processes made obvious by those taught herein.

Though various portions of this specification have been provided with headers, it is not intended that the headers be used to limit the application of teachings found in one portion of the specification from applying to other portions of the specification. For example, alternatives acknowledged in association with one embodiment, are intended to apply to all embodiments to the extent that the features of the different embodiments make such application functional and do not otherwise contradict or remove all benefits of the adopted embodiment. Various other embodiments of the present invention exist. Some of these embodiments may be based on a combination of the teachings set forth herein with various teachings incorporated herein by reference.

It is intended that the aspects of the invention set forth herein represent independent invention descriptions which Applicant contemplates as full and complete invention descriptions that Applicant believes may be set forth as independent claims without need of importing additional limitations or elements, from other embodiments or aspects set forth herein, for interpretation or clarification other than when explicitly set forth in such independent claims once written. It is also understood that any variations of the aspects set forth herein represent individual and separate features that may form separate independent claims, be individually added to independent claims, or added as dependent claims to further define an invention being claimed by those respective dependent claims should they be written.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter, subsequently amended, or subsequently set forth in an application that claims priority to this application.

I claim:

1. A multi-layer elongated probe for making an electrical connection, the probe comprising:
   a tip end comprising at least one layer;
   a base end comprising at least one layer; and
   an intermediate region comprising at least one elastically compliant region formed from materials that are different from the tip end and the base end,
      wherein the intermediate region connects the tip end to the base end,
      wherein the intermediate region is formed from at least three layers and at least two distinct materials,
      wherein for a plurality of pairs of adjacent layers, each pair includes a first adjacent layer and a second adjacent layer,
      wherein a material on one of the first and second adjacent layers is different from a material on the other of the first and second adjacent layers,
      wherein the elastically compliant region of the probe has a preferential bending axis that extends substantially parallel to planes of the layers when subjected to a compressive force between the base end and the tip end, and
      wherein the probe is defined by a notch in the at least one elastically compliant region on a side of the probe that provides for preferential bending of the probe such that the at least one elastically compliant region bulges to another side of the probe.

2. The probe of claim 1 wherein the electrical connection is selected from the group consisting of: (1) a temporary connection for wafer level testing of a semiconductor device; (2) a temporary connection for testing an electronic component comprising a diced semiconductor device; (3) a temporary connection for an electronic component comprising a packaged semiconductor device; (4) a permanent connection for testing an electronic component comprising a diced semiconductor device; and (5) a permanent connection for an electronic component comprising a packaged semiconductor device.

3. The probe of claim 1 wherein each of a plurality of layers of the probe has a substantially uniform thickness in a layer stacking direction across its width and length, and a ratio of a longitudinal length of the probe to a thickness of the elastically compliant region of the probe in a layer stacking direction is selected from the group consisting of (1)=>40, (2)=>60, (3)=>80, (4)=>100, and (5)=>120 and wherein a ratio of a longitudinal length of the probe to a width of the elastically compliant region of the probe perpendicular to a layer stacking direction is selected from the group consisting of (1)=>40, (2)=>60, (3)=>80, (4)=>100, and (5)=>120.

4. The probe of claim 3 wherein the layers are planar.

5. The probe of claim 3 wherein the layers have discontinuities, curvature, or changes in width along at least a portion of a longitudinal length of the probe.

6. The probe of claim 3 wherein probe has a stair stepped configuration in a layer stacking direction along at least a portion of a longitudinal length of a compliant portion of the probe.

7. The probe of claim 3 wherein probe has a stair stepped configuration in a layer stacking direction along at least a portion of a longitudinal length of a compliant portion of the probe due to at least two consecutive layers having different cross-sectional configurations in a compliant portion of the probe.

8. The probe of claim 1 wherein the probe is formed as a linear structure.

9. The probe of claim 1 wherein the at least three layers comprises at least four layers.

10. The probe of claim 9 wherein the at least four layers comprise at least five layers.

11. The probe of claim 10 wherein the at least five layers comprise at least seven layers.

12. The probe of claim 1 wherein the preferential bending axis is based, at least in part, on the thickness of probe in the layer stacking direction in the elastically compliant region being less than a width of the probe.

13. The probe of claim 1 wherein the material forming the elastically complaint portion comprises a stiffer material as part of outer probe layers relative to at least one inner layer.

14. The probe of claim 1 wherein the tip region of the probe comprises at least one material as part of at least one layer that has a higher yield strength than any material of the elastically compliant portion of outer probe layers.

15. The probe of claim 1 wherein the base region of the probe comprises at least one material as part of at least one layer that has a higher yield strength than any material of the elastically compliant portion of the outer layers.

16. A probe array comprising a plurality of multi-layer elongated probes for making an electrical connection, the probe array comprising:
(a) a plurality of probes, with each probe comprising:
a base end comprising at least one layer; and
(ii) an intermediate region comprising at least one elastically compliant region formed from materials that are different from the tip end and the base end, wherein the intermediate region connects the tip end to the base end, wherein the intermediate region is formed from at least three layers and at least two distinct materials, wherein for a plurality of pairs of adjacent layers, each pair includes a first adjacent layer and a second adjacent layer, wherein a material on one of the first and second adjacent layers is different from a material on the other of the first and second adjacent layers, and wherein the probe is defined by a notch in the at least one elastically compliant region on a side of the probe that provides for preferential bending of the probe such that the at least one elastically compliant region bulges to another side of the probe;
(b) at least one guide plate for aligning at least one of the top or bottoms of probes in a desired array configuration wherein at least one end of each probe, when held by the guide plate, is capable of movement along an axis when contacted to an electronic component,
wherein the elastically compliant region of a plurality of the probes have preferential configurations, when held by the at least one guide plate, to bend in a plane that includes a normal of the multiple layers of each respective probe and the axis of movement of the respective probe when contacted to the electronic component.

17. A probe array comprising a plurality of multi-layer elongated probes for making an electrical connection, the probe array comprising:
(a) a plurality of probes, with each probe comprising:
a base end comprising at least one layer; and
(ii) an intermediate region comprising at least one elastically compliant region formed from materials that are different from the tip end and the base end, wherein the intermediate region connects the tip end to the base end, wherein the intermediate region is formed from at least three layers and at least two distinct materials, wherein for a plurality of pairs of adjacent layers, each pair includes a first adjacent layer and a second adjacent layer, wherein a material on one of the first and second adjacent layers is different from a material on the other of the first and second adjacent layers, and wherein the probe is defined by a notch in the at least one elastically compliant region on a side of the probe that provides for preferential bending of the probe such that the at least one elastically compliant region bulges to another side of the probe;
(b) at least two guide plates for aligning top and bottoms of probes in a desired array configuration wherein at least one end of each probe, when held by the guide plates, is capable of movement along an axis when contacted to an electronic component,
wherein the elastically compliant region of a plurality of the probes have preferential configurations, when held by the guide plates, to bend in a plane that includes a normal of the multiple layers of each respective probe and the axis of movement of the respective probe when contacted to the electronic component.

* * * * *